United States Patent
Takai (10) Patent No.: US 10,256,129 B2
(45) Date of Patent: Apr. 9, 2019

(54) CARRIER BUFFERING DEVICE AND BUFFERING METHOD

(71) Applicant: Murata Machinery, Ltd., Kyoto-shi, Kyoto (JP)

(72) Inventor: Kaname Takai, Inuyama (JP)

(73) Assignee: Murata Machinery, Ltd. (JP)

( * ) Notice: Subject to any disclaimer, the term of this patent is extended or adjusted under 35 U.S.C. 154(b) by 211 days.

(21) Appl. No.: 15/315,345

(22) PCT Filed: Apr. 30, 2015

(86) PCT No.: PCT/JP2015/062939
§ 371 (c)(1),
(2) Date: Nov. 30, 2016

(87) PCT Pub. No.: WO2015/194265
PCT Pub. Date: Dec. 23, 2015

(65) Prior Publication Data
US 2017/0186639 A1 Jun. 29, 2017

(30) Foreign Application Priority Data
Jun. 19, 2014 (JP) .................. 2014-126014

(51) Int. Cl.
*H01L 21/677* (2006.01)

(52) U.S. Cl.
CPC .. *H01L 21/67769* (2013.01); *H01L 21/67733* (2013.01); *H01L 21/67736* (2013.01)

(58) Field of Classification Search
CPC ......... H01L 21/67769; H01L 21/67724; H01L 21/67773; H01L 21/67733; H01L 21/67736; H01L 21/67775
See application file for complete search history.

(56) References Cited

U.S. PATENT DOCUMENTS

| | | | | |
|---|---|---|---|---|
| 8,123,456 | B2 * | 2/2012 | Wakabayashi | .... H01L 21/67733 414/281 |
| 8,915,690 | B2 * | 12/2014 | Ota | ................... H01L 21/67733 414/275 |

(Continued)

FOREIGN PATENT DOCUMENTS

| JP | 2012-111635 A | 6/2012 |
|---|---|---|
| KR | 2011-0027935 | 3/2011 |

OTHER PUBLICATIONS

Supplementary European Search Report dated Jan. 17, 2018, of corresponding European Application No. 15809185.0.

(Continued)

*Primary Examiner* — Glenn F Myers
(74) *Attorney, Agent, or Firm* — DLA Piper LLP (US)

(57) ABSTRACT

A temporary storage apparatus is provided with a slidable buffer which does not prevent installation of the apparatus and maintenance of equipment, has increased storing capacity for carriers without a lateral transfer mechanism in a local vehicle, stores carriers between overhead travelling vehicles and a load port, and is provided with the local vehicle travelling on a rail below the rail for the overhead travelling vehicles and a slidable buffer comprising a cell to support a carrier and a guide mechanism sliding the slidable buffer between an advanced position under the rail and a backward position laterally shifted from the rail. The guide mechanism moves between an active position laterally protruding from the rail and a retracted position allowing transfer by the overhead travelling vehicles between the load port. The rail extends along the front face of the equipment to a waiting position separated from a position over the port.

4 Claims, 8 Drawing Sheets

(56) References Cited

U.S. PATENT DOCUMENTS

| | | | |
|---|---|---|---|
| 2009/0060697 A1* | 3/2009 | Wakabayashi | H01L 21/67733 414/564 |
| 2010/0290873 A1 | 11/2010 | Bonora et al. | |
| 2012/0004767 A1 | 1/2012 | Tominaga | |
| 2012/0263562 A1* | 10/2012 | Mizokawa | H01L 21/67733 414/618 |
| 2012/0275886 A1* | 11/2012 | Ota | H01L 21/67733 414/222.08 |

OTHER PUBLICATIONS

English language translation of International Search Report dated Jul. 21, 2015 issued in corresponding PCT application PCT/JP2015/062939.

English translation of the International Preliminary Report on Patentability dated Dec. 29, 2016, for counterpart International Application No. PCT/JP2015/062939.

* cited by examiner

CARRIER BUFFERING DEVICE AND BUFFERING METHOD

CROSS REFERENCE TO RELATED APPLICATIONS

This application is a national stage of international application no. PCT/JP2015/062939, filed on Apr. 30, 2015, and claims the benefit of priority under 35 USC 119 of Japanese application no. 2014-126014, filed on Jun. 19, 2014, both of which are incorporated herein by reference in their entirety.

BACKGROUND OF THE INVENTION

Field of the Invention

The present invention relates to temporarily storing carriers to house semiconductor wafers or the like.

Description of the Related Art

In order to improve the utilisation rate of semiconductor fabrication equipment, temporal storage apparatuses (buffers) are provided in the vicinity of load ports of semiconductor fabrication equipment. In this regard, Patent Literature 1 (JP 2012-111635) by the applicant has proposed to provide a travelling rail for a local vehicle in parallel with and below a travelling rail for overhead travelling vehicles (overhead hoist transports (OHT)). If buffers usable for both the local vehicle and the overhead travelling vehicles are provided at positions below the travelling rail for the local vehicle and not over the load ports, for example, four buffers may be provided. If further buffers are necessary, one design is to provide the overhead travelling vehicles and the local vehicle with a lateral transfer mechanism for carriers and to provide additional buffers at downward and sideways positions from the travelling rail for the local vehicle.

CITATION LIST

Patent Literature

Patent Literature 1: JP 2012-111635

SUMMARY OF THE INVENTION

Problem to be Solved by the Invention

However, if the local vehicle is provided with a lateral transfer mechanism for the carriers, then the height of the local vehicle increases, and the space occupied by the temporary storage apparatus increases. Therefore, the present inventor has considered a slidable buffer slidable between an advanced position under the travelling rail for the local vehicle and a backwards position laterally separated from the travelling rail. Since the slidable buffer advances to the advanced position over the load port, the buffers increase in number. Further, the local vehicle does not need a lateral transfer mechanism for carriers.

Next, the inventor noted that the slidable buffer prevents the installation of the temporary storage apparatus and the maintenance of the equipment, for example. This is because the slidable buffer laterally protrudes toward the passage, for example. Therefore, it is necessary to make the slidable buffer not prevent the installation of the temporary storage apparatus or the maintenance of the equipment, for example.

The problem to be solved by the present invention is to provide a temporary storage apparatus:

provided with a slidable buffer with increased capacity for temporarily storing carriers and a local vehicle without a lateral transfer mechanism for carriers; and the slidable buffer not preventing the installation of the temporary storage apparatus or the maintenance of the equipment, for example.

Means for Solving Problem

A temporary storage apparatus according to one aspect of the present invention, temporarily stores carriers between overhead travelling vehicles and a load port located in front of equipment and comprises:

a local vehicle provided with a hoist for raising and lowering a carrier;

a travelling rail for the local vehicle passing over the load port and provided below a travelling path of the overhead travelling vehicles; and a slidable buffer comprising: a cell configurated to support a carrier thereon; and a guide mechanism configured to support and slide the cell between an advanced position under the travelling rail and a backwards position laterally separated from the travelling rail, wherein the guide mechanism is configured to move between an active position laterally protruding from the travelling rail, and a retracted position laterally less protruding from the travelling rail by a shorter length than the active position and allowing an overhead travelling vehicle to transfer a carrier between the load port, wherein the travelling rail extends along a front face of the equipment to a waiting position separated from a position over the load port, and wherein the local vehicle is configured to wait at the waiting position.

A temporary storage method according to another aspect of the present invention, temporarily stores carriers between overhead travelling vehicles and a load port located in front of equipment, with usage of a temporary storage apparatus which comprises:

a local vehicle provided with a hoist for raising and lowering a carrier;

a travelling rail for the local vehicle passing over the load port and provided below a travelling path of the overhead travelling vehicles;

a slidable buffer comprising: a cell configurated to support a carrier thereon; and a guide mechanism configured to support and slide the cell between an advanced position under the travelling rail and a backwards position laterally separated from the travelling rail, and a horizontal axis configured to rotate the guide mechanism, and the temporary storage method comprises the steps of:

under control of a controller, moving the local vehicle to a waiting position to wait, when no work is to be allocated to the local vehicle; and changing an attitude of the slidable buffer between an active position at which the guide mechanism laterally protrudes from the travelling rail and a retracted position at which the guide mechanism extends in a height direction by rotating the slidable buffer about the horizontal axis.

The slidable buffer may be provided so as to advance to the advanced position over a load port, and therefore, a larger number of slidable buffers may be provided than the number of fixed buffers. Also, since the cell of the slidable buffer slides, the local vehicle does not need a lateral transfer mechanism for a carrier. Furthermore, since the local vehicle waits at a position not over the load port, a trouble of the local vehicle does not prevent the overhead travelling vehicle from transferring a carrier between the load port. The local vehicle may autonomously move to the waiting position by an on-board controller or move to the waiting position with an instruction from a controller for the temporary storage apparatus (e.g. the buffer controller in the embodiment).

The cell (e.g., a shelf for storing one carrier) of the slidable buffer may be retracted together with the guide mechanism, and therefore, after retracting the cell and the guide mechanism, the temporary storage apparatus may be easily installed, and maintenance, installation, and so on of the equipment are easily performed. When the slidable buffer is at the retracted position, the overhead travelling vehicle is allowed to transfer a carrier between a load port. Therefore, if the cell and the guide mechanism are retracted for keeping the passage wide for the maintenance of another piece of equipment and so on, carriers may be transferred between the load port and the overhead travelling vehicles. In the present specification, the descriptions regarding the temporary storage apparatus apply to the temporary storage method as they are.

Preferably, the guide mechanism is attached to a frame of the temporary storage apparatus in a rotatable manner together with the cell about an axis parallel to the travelling rail, and the guide mechanism and the cell are made separated from positions under the travelling rail at the retracted position. If the guide mechanism is rotated to the retracted position together with the cell about the axis parallel to the travelling rail, the cell and the guide mechanism are separated from positions under the travelling rail, and therefore, the overhead travelling vehicle may transfer between the load port. Also, if the temporary storage apparatus is provided with a fixed buffer in addition to the slidable buffer, the local vehicle may transfer between the fixed buffer and the load port, when the slidable buffer is retracted.

Preferably, the temporary storage apparatus is provided with a controller that controls the slidable buffer and the local vehicle, and the controller is configured and programmed to notify a controller for the overhead travelling vehicle that the slidable buffer is disabled when the guide mechanism is moved to the retracted position. With the feature, when the guide mechanism of the slidable buffer is retracted for maintenance, installation, and so on of the equipment, the controller of the temporary storage apparatus is inputted by a sensor or the like detecting the rotation of the guide mechanism, or by an operator. The controller of the temporary storage apparatus notifies the controller for the overhead travelling vehicle of the fact. The controller for the overhead travelling vehicle removes the slidable buffer from the list of possible destinations, and therefore, transportation by the overhead travelling vehicles is not disturbed. Note that rotation of the guide mechanism in the slidable buffer about a horizontal axis allows the transfer between the load port and the overhead travelling vehicles.

Preferably, the temporary storage apparatus is provided with a fixed buffer at a position under the travelling rail for the local vehicle and separated from a position over the load port. The waiting position is located above the fixed buffer.

Preferably, a horizontal axis rotatably supporting the guide mechanism is further provided so that the guide mechanism extends along a vertical direction at the retracted position. With this feature, the slidable buffer retracts by rotation, and at the retracted position, the slidable buffer does not prevent transfer between the load port and laterally protrudes from the travelling rail at most by a small amount.

Preferably, the temporary storage apparatus is further provided with a lower trestle part configured to be fixed on a floor surface, and an upper trestle part detachable from the lower trestle part and fixed with a frame of the temporary storage apparatus, and the travelling rail and the guide mechanism are attached to the frame. Note that the local vehicle is supported by the travelling rail, and the cell of the slidable buffer is supported by the guide mechanism. With the feature, the frame of the temporary storage apparatus may be fixed to the upper trestle part in advance, and thus, the installation of the temporary storage apparatus becomes easier. Also, the lower trestle part may be fixed to the floor surface in advance, and the height of the temporary storage apparatus, when installed, is reduced.

DETAILED DESCRIPTION OF THE PREFERRED EMBODIMENTS

The best embodiment for carrying out the present invention is described in the following. The scope of the present invention is based on the claims and is to be construed with reference to the description and well-known techniques in the field in accordance with understanding of a person skilled in the art.

Embodiment

Figure 1:
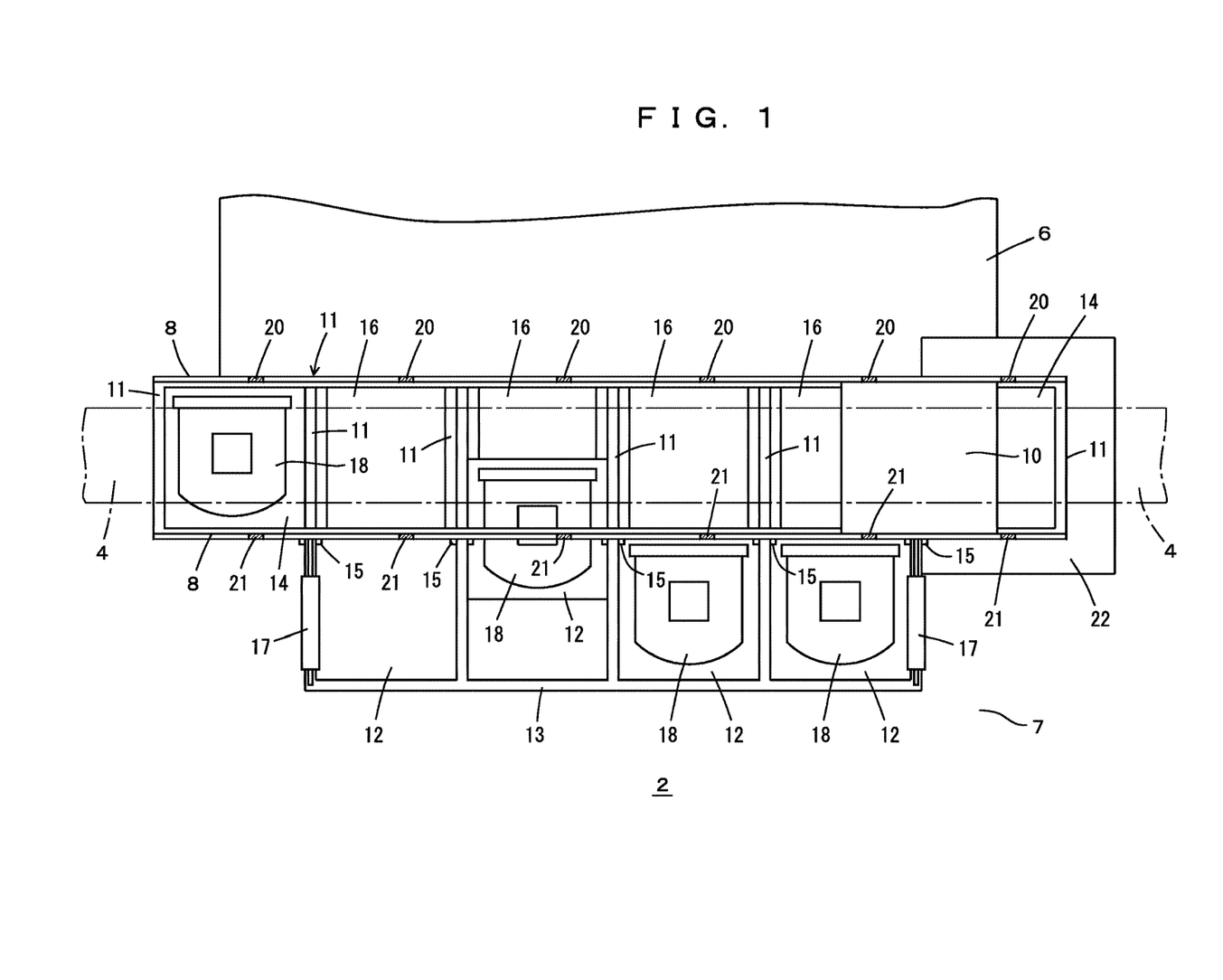
FIG. 1 is a plan view of a temporary storage apparatus for carriers according to an embodiment.
Figure 2:
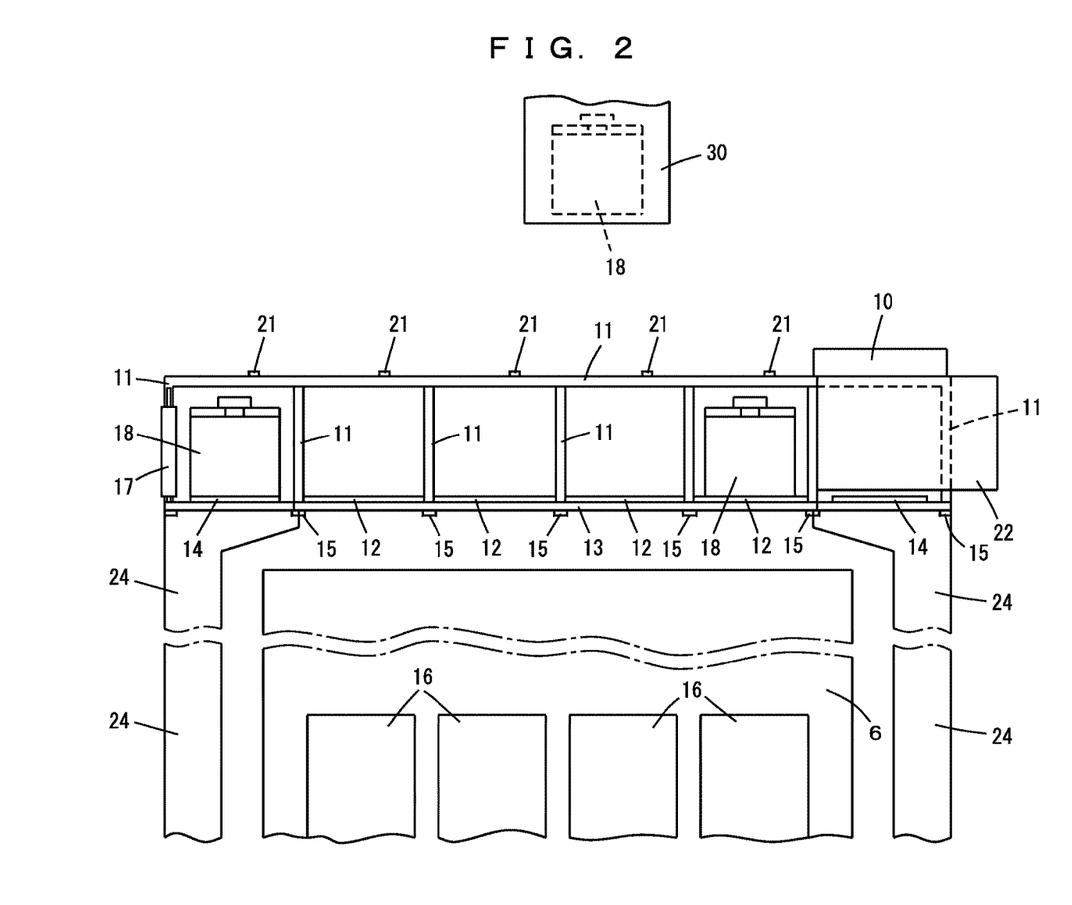
FIG. 2 is a fragmentary side view of the temporary storage apparatus for carriers according to the embodiment.
Figure 3:
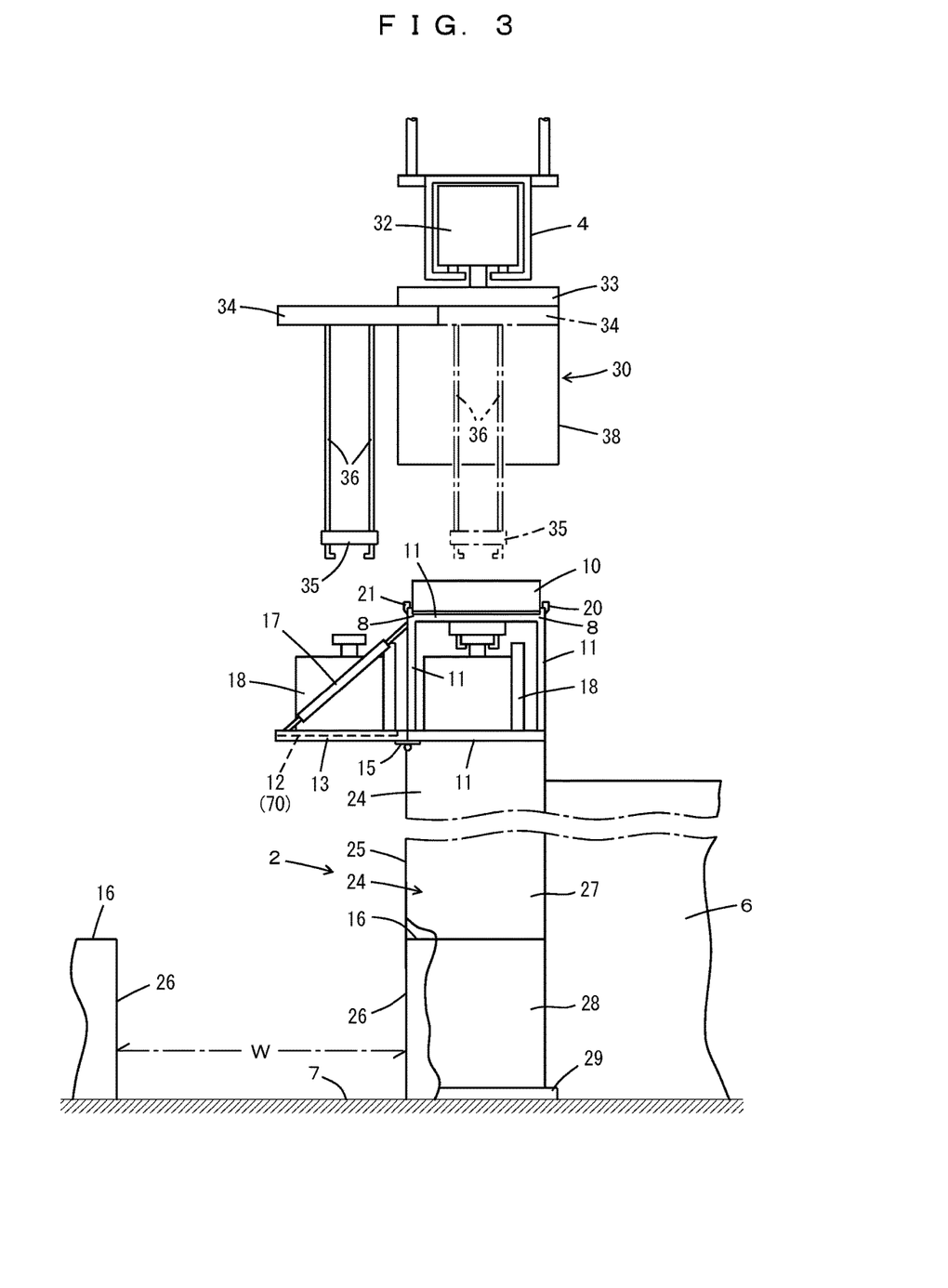
FIG. 3 is a fragmentary front view of the temporary storage apparatus for carriers according to the embodiment.

FIGS. 1 to 10 show a temporary storage apparatus 2 for carriers (a temporary storage apparatus) according to an embodiment of the invention and modifications thereof. The temporary storage apparatus 2 is provided in a cleanroom or the like, and travelling rail 4 for an overhead travelling vehicle (OHT) 30, as is shown in FIG. 3, is supported from the ceiling of the cleanroom. Reference numeral 6 indicates fabrication equipment for semiconductors or the like, and the equipment includes an inspection apparatus and is provided with one or more load ports 16. Articles such as semiconductor wafers and reticles are housed in a carrier 18 such as a FOUP (front-opening unified pod), the carrier is temporarily stored on slidable buffers 12 and fixed buffers 14 and is transported by the overhead travelling vehicle (OHT) 30 and a local vehicle 10.

The temporary storage apparatus 2 is provided over a passage 7 in the cleanroom at a height without interference with people. On the uppermost portion of the temporary storage apparatus 2, a pair of travelling rails 8,8 are provided, a local vehicle 10 travels along the travelling rails 8,8 over the load ports 16 in parallel with the front surface of the equipment 6. There is a gap between the travelling rails 8,8 for passing the carrier 18, and the overhead travelling vehicles 30 and the local vehicle 10 transfer the carrier 18 through the gap between the travelling rails 8,8.

The temporary storage apparatus 2 is provided with a frame 11, and, to the frame 11, a frame 13 of the slidable buffers 12 is attached by a hinge 15 so as to be rotatable by 90° about a horizontal axis parallel with the travelling rails 8,8. The slidable buffers 12 can move back and forth between an advanced position under the travelling rails 8,8 and a backward position laterally separated from positions under the travelling rails 8,8. Preferably, in addition to the slidable buffers 12, a fixed buffer 14 is provided at one or both ends of the travelling rails 8,8. Positions over the load ports 16 and positions over the fixed buffers 14 are stopping positions for the local vehicle 10 and the overhead travelling vehicle 30, and the positions over the fixed buffers 14 also serve as waiting positions for the local vehicle 10. Further slidable buffers 12 may be provided in place of the fixed buffers 14 to omit the fixed buffers 14. Since positions not over the load ports 16 are used as the waiting positions for the local vehicle 10, a problem with the local vehicle 10 does not prevent the transfer between the load ports 16 and the overhead travelling vehicle 30.

The frame 13 is rotatably attached to the frame 11 by the hinge 15 and may be rotated downward by 90° from the attitude shown in FIG. 1. A reference numeral 17 indicates a damper that applies an upward force to the frame 13. The damper 17 is an air cylinder, for example, and may be a hydraulic cylinder or a simple element such as a spring. Air necessary for driving the damper 17 is supplied via, for example, a trestle 24 shown in FIGS. 2 and 3. When the frame 13 is rotated about the hinge 15, the weight of the frame 13 and the slidable buffers 12 is supported by the damper 17 so as to rotate the frame 13 easily.

Reference numerals 20 and 21 respectively indicate an optical sensor and a reflection plate which are provided at each stopping position. The optical sensor 20 detects an elevation platform extending from the overhead travelling vehicle 30, belts by which the elevation platform is suspended, or a carrier held by the elevation platform by detecting that the path between the optical sensor 20 and the reflection plate 21 has been blocked. Reference numeral 22 indicates a buffer controller that controls the local vehicle 10 and the slidable buffers 12, establishes interlock between the overhead travelling vehicle 30 and the local vehicle 10, communicates with a controller for the overhead travelling vehicle 30, and communicates with the equipment 6.

The buffer controller 22 operates as follows:
  when the overhead travelling vehicle 30 or the local vehicle 10 transfer a carrier 18 between a load port 16, the buffer controller 22 makes the slidable buffer 12 located over the load port 16 related to the transfer retracted;
  when the local vehicle 10 transfers a carrier 18 between a slidable buffer 12, the buffer controller 22 makes the slidable buffer 12 move forward;
  in response to a request from the overhead travelling vehicle 30 or a ground controller thereof, the buffer controller 22 makes the slidable buffer 12 move forward or rearward for the transfer of a carrier 18; and
  when no work is to be allocated to the local vehicle 10, the buffer controller 22 makes the local vehicle 10 move to a waiting position above the fixed buffer 14 and keeps the local vehicle 10 waiting.

As shown in FIGS. 2 and 3, the temporary storage apparatus 2 is supported by a pair of trestles 24 that have a gate-like shape. Front faces 25 of the trestles 24 toward the passage 7 are located, relative to the passage 7, at approximately the same position as front faces 26 of the load ports 16 or closer to the equipment 6 than the front faces 26. Therefore, the width W of the passage 7 is dependent on the positions of the load ports 16, and temporary storage apparatus 2 does not make the width W of the passage 7 narrower. "Approximately the same" means that the difference between the front faces is up to ±100 mm, particularly up to ±50 mm, and preferably the front faces 25 and 26 are located at substantially the same position. The temporary storage apparatus 2 may be suspended from the ceiling of the cleanroom or from the travelling rail 4 for the overhead travelling vehicles 30. However, it is easy to transport, install, and position the temporary storage apparatus 2 supported by the trestles 24 into the cleanroom. The trestles 24 having the front faces 25 not protruding toward the passage 7 over the load ports 16 do not make the passage narrower.

The trestle 24 comprises an upper part 27 and a lower part 28 fastened to each other by a screw or the like, and the lower part 28 is fixed on a floor surface or the like in the cleanroom by a connecting portion 29. The temporary storage apparatus 2 is fixed to the upper part 27 in advance, and the upper part 27 is fixed on the lower part 28 so as to install the temporary storage apparatus 2. By this method, the height that the temporary storage apparatus 2 occupies when transported into the cleanroom is reduced. Further, in order to lower the center of gravity of the temporary storage apparatus 2 and make the temporary storage apparatus 2 more robust against an earthquake, the lower part 28 is made of a thick steel material or the like so as to be heavy.

The structure of the overhead travelling vehicles 30 is shown in FIG. 3. A travelling unit 32 travels in the travelling rail 4 and also supports a lateral transfer mechanism 33 which laterally moves a raising and lowering drive 34 in a horizontal direction orthogonal to the travelling rail 4. The raising and lowering drive 34 feeds and winds up suspenders such as belts 36 to raise and lower an elevation platform 35 that holds and releases a carrier 18. A hoist comprises the raising and lowering drive 34, the elevation platform 35, and the belts 36. The optical sensor 20 previously mentioned detects the hoist and the carrier supported by the hoist. Reference numeral 38 indicates an anti-fall hood that prevents the carrier 18 from falling. In addition, a mechanism for rotating the raising and lowering drive 34 about a vertical axis may also be provided. For an overhead travelling vehicle without the lateral transfer mechanism 33, the slidable buffers 12 move forward to positions under the travelling rails 8,8.

Figure 4:
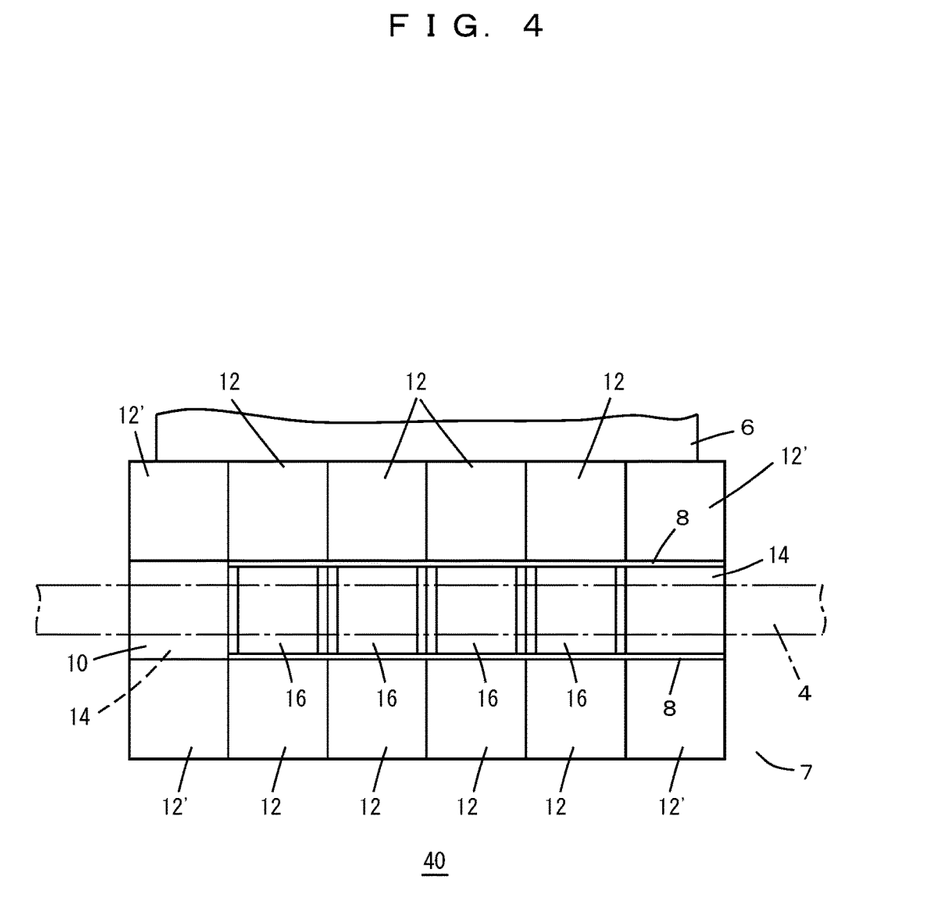
FIG. 4 is a plan view schematically showing a modification with an increased storage capacity.
Figure 5:
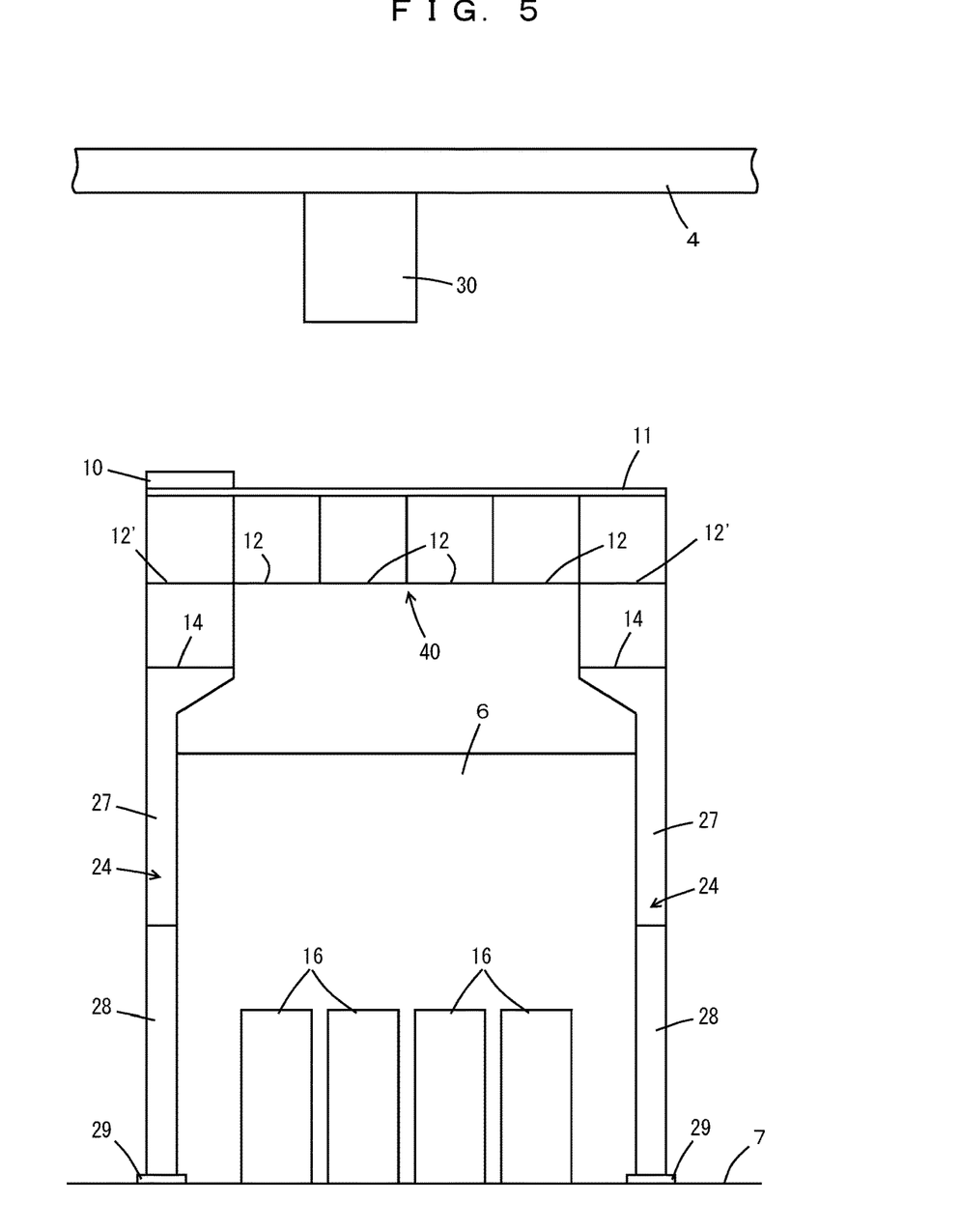
FIG. 5 is a side view schematically showing the modification with an increased storage capacity.

The temporary storage apparatus 2 shown in FIGS. 1 to 3 is provided with four slidable buffers 12 and two fixed buffers 14, and the equipment 6 is provided with four load ports 16, for example. A temporary storage apparatus 40 with maximum capacity for storing carriers 18 and serving the four load ports 16 is shown in FIGS. 4 and 5. In the temporary storage apparatus 40, the fixed buffers 14 are located at positions lower than the slidable buffers 12 by a height corresponding to one carrier (FIG. 5), and consequently the occupation height of the temporary storage apparatus 40 is made larger. The slidable buffers 12 are provided on both sides of the travelling rails 8,8, and further slidable buffers 12' are provided at positions above the fixed buffers 14 and shifted from the load ports 16 so that they move forward over the fixed buffer. As a result, eight slidable buffers 12, four slidable buffers 12' separated from the load ports 16, and two fixed buffers 14 are provided, and positions over the fixed buffers 14 are the waiting positions for the local vehicle 10.

Figure 6:
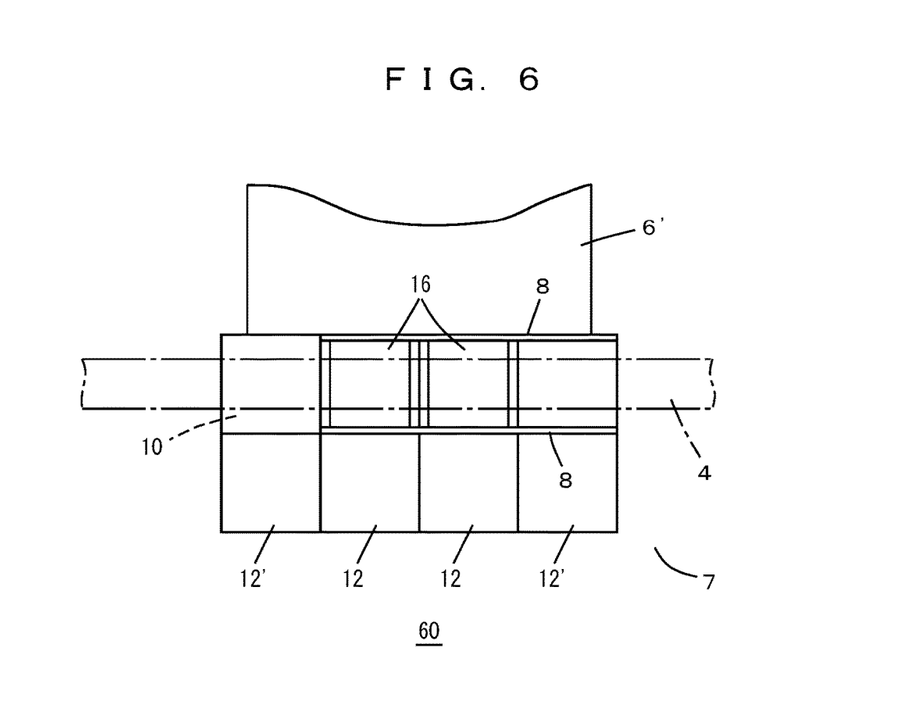
FIG. 6 is a plan view schematically showing another modification for small equipment.

FIG. 6 shows a temporary storage apparatus 60 for small equipment 6' and with a smaller storage capacity. The equipment 6' is provided with two load ports 16, and the temporary storage apparatus 60 is provided with four slidable buffers. Positions over the slidable buffers 12' separated from the load ports 16 are the waiting positions for the local vehicle 10. While a structure similar to that shown in FIG. 5 allows two additional fixed buffers 14, it increases the height of the temporary storage apparatus 60.

Figure 7:
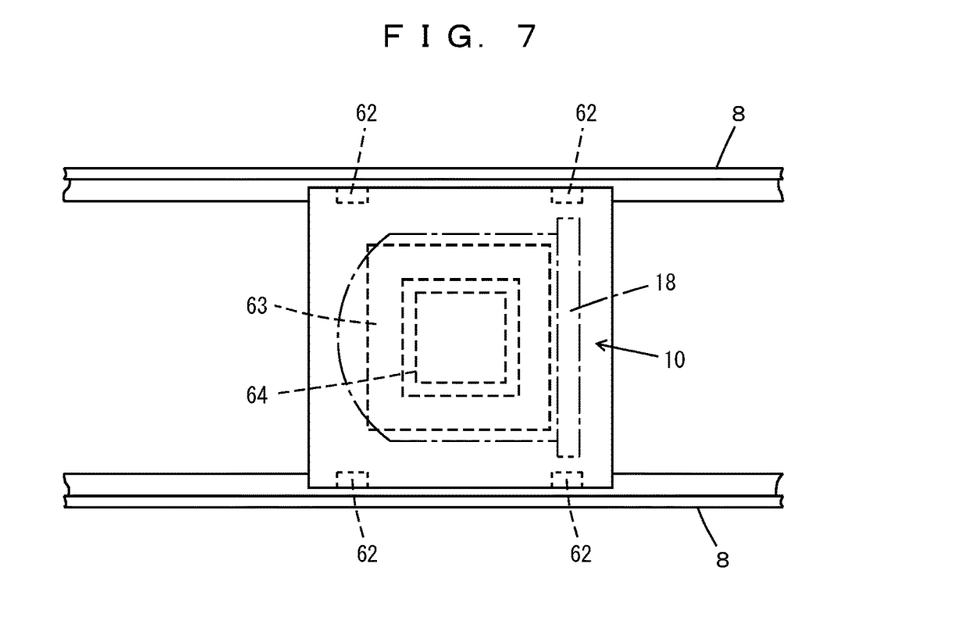
FIG. 7 is a plan view of a local vehicle.

FIG. 7 shows the structure of the local vehicle 10. The local vehicle 10 travels along the pair of travelling rails 8 by wheels 62 and an unshown motor and raises and lowers an elevation platform 64 to hold and release the carrier 18 by a raising and lowering drive 63, unshown belts, and so on. In addition to them, the local vehicle 10 is further provided with a communication device to communicate with the buffer controller 22, another communication device to communicate with a terminal 30 for interlock between the overhead travelling vehicle, a power supply such as a battery, and an on-board controller.

Figure 8:
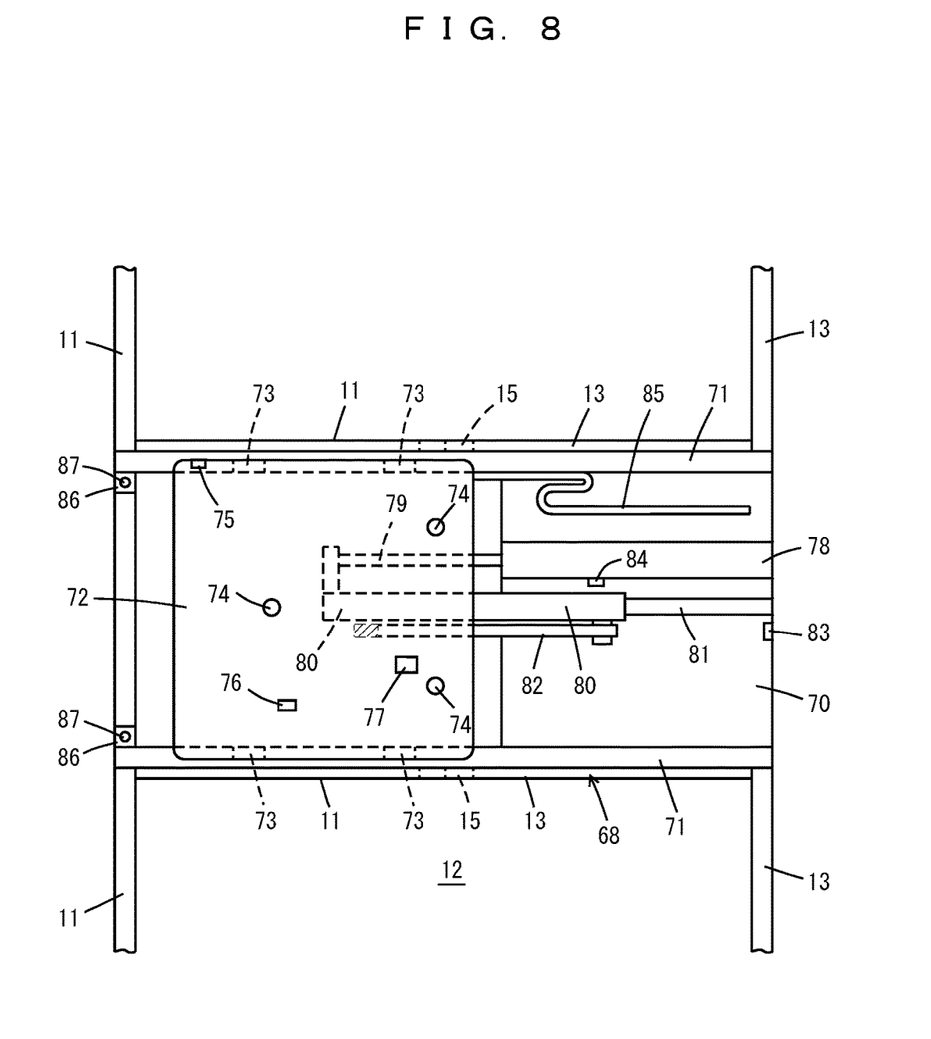
FIG. 8 is a plan view of a slidable buffer.

FIG. 8 shows the structure of the slidable buffer 12 which comprises a cell 72 and a guide mechanism 68 for moving the cell 72 between an advanced position and a backward position. Reference numeral 70 indicates a base of the guide mechanism 68 which is fixed to the frame 13. The cell 72 moves back and forth between the advanced position and the backward position along rails 71,71 by wheels 73. The advanced position is a position under the travelling rails for the local vehicle and, for example, over the load ports 16. The backward position is a position laterally separated from the advanced position. For example, three positioning pins 74 provided on the cell 72 position the bottom portion of the carrier 18. A carrier sensor 75 detects whether the carrier 18 is present, a seating sensor 76 detects whether the carrier 18 is seated at a correct position over the positioning pins 74, and an ID reader 77 reads the ID of the carrier. The ID reader 77 may be omitted, and both the sensors 75, 76 and the ID reader 77 are provided for the fixed buffers in the same manner.

A linear guide 80 is moved back and forth along a rail 81 by a cylinder 78 such as a pneumatic cylinder or a hydraulic cylinder and a piston 79 or by a motor and a toothed belt or the like (not shown). The cell 72 is moved back and forth by a double speed mechanism comprising a toothed belt 82 and so on, at twice the stroke of the linear guide 80. The double speed mechanism has been widely used in slide forks, and another mechanism may be adopted to move the cell 72 back and forth. A sensor 83 detects that the linear guide 80 is at a backward position, and a sensor 84 detects that the linear guide 80 is at an advanced position. A cable guide 85 guides a power supply line and a signal line bendably and connects the sensors 75, 76 and the ID reader 77 to the base 70. The sensors 83 and 84 act to detect the positions of the cell 72, and the rails 71 may be provided with, for example, an optical sensor for detecting the front end position of the cell and an optical sensor for detecting the rear end position of the cell.

Figure 9:
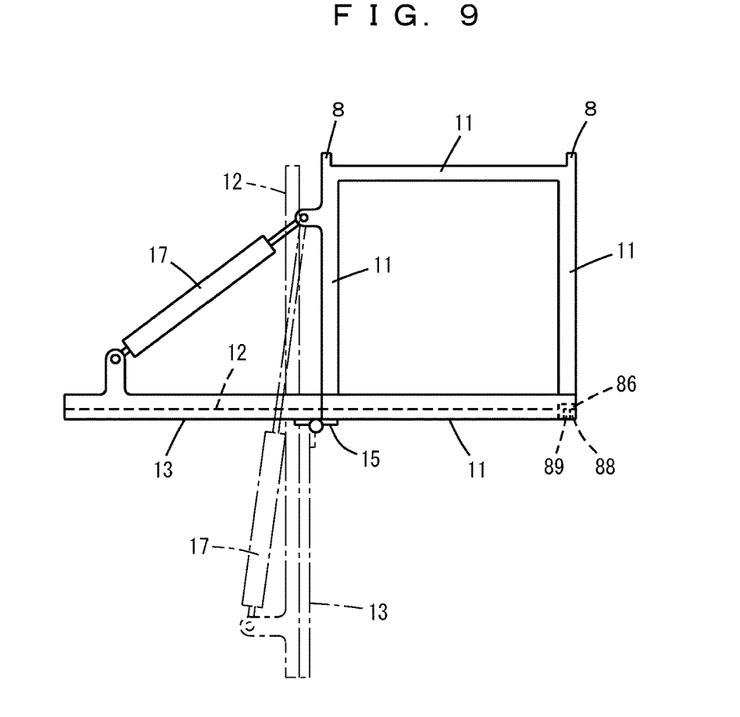
FIG. 9 is a front view showing a rotation mechanism for a slidable buffer

As shown in FIG. 9, the frame 13 and the slidable buffer 12 are configured to rotate about the hinge 15 by 90° between a horizontal attitude (the solid line) and a vertical attitude (the broken line). Reference numeral 86 in FIG. 8 indicates brackets provided at a tip end of the rail 71, and are provided with a pin hole 87 respectively. Returning to FIG. 9, usually the brackets 86 are placed on brackets 88 of the frame 11 and the brackets 86 are fixed to the brackets 88 by pins 89 or the like. When retracting the slidable buffer 12, the pins 89 are removed and the frame 13 and the slidable buffer 12 are integrally rotated about the hinge 15. The slidable buffer 12 retracts from the gap between the travelling rails 8,8 to a retracted position, and therefore, the overhead travelling vehicle may transfer a carrier between a load port. In the embodiment, the slidable buffers 12 retract in the counterclockwise direction, however, it may rotate and retract in the clockwise direction. Also, while the frame 13 and all of the slidable buffers 12 are rotated together in the embodiment, the slidable buffers 12 may be configured to rotate individually.

In some cases, the total weight of the frame 13 and the slidable buffers 12 are too heavy to be manually rotated. Therefore, an upward force is applied to the frame 13 by the damper 17 so as to rotate manually the frame 13 and the slidable buffers 12 easily.

Figure 10:
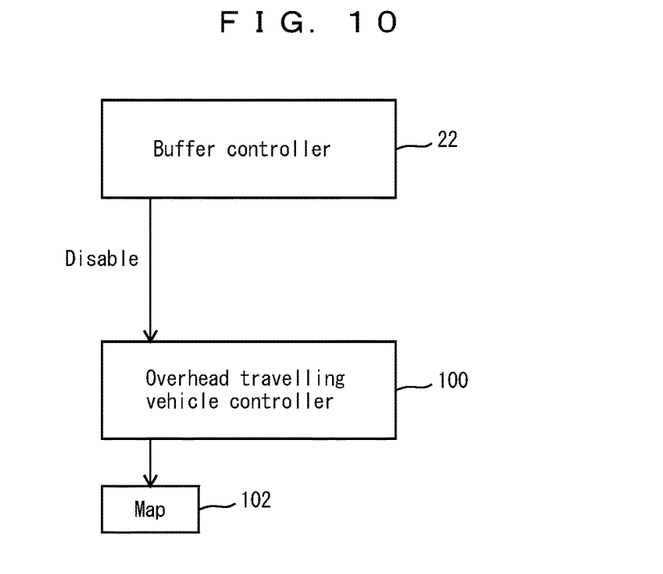
FIG. 10 is a diagram showing a relationship between a buffer controller and a controller of an overhead travelling vehicle.

FIG. 10 shows a relationship between the buffer controller 22 and an overhead travelling vehicle controller 100. An overhead travelling vehicle controller 100 stores a map 102 of the travelling path in a memory, and the map 102 indicates the positions of the slidable buffers 12 as well as the alternative destinations. When slidable buffers are retracted, the buffer controller 22 notifies the overhead travelling vehicle controller 100 that the slidable buffers are disabled, and the overhead travelling vehicle controller 100 writes this in the map 102. Further, the overhead travelling vehicle controller 100 changes an instruction of which designation is the temporary storage apparatus 2 to an instruction to an alternative destination. If no alternative destination is registered, based on the map 102, a new alternative destination is decided. With this arrangement, if a slidable buffer is temporarily disabled according to maintenance work of the equipment and so on, transportation by the overhead travelling vehicles is not disturbed.

The embodiment has the following advantageous effects.
1) A large number of carriers can be stored on the slidable buffers 12.
2) The local vehicle 10 does not need a lateral transfer mechanism for carriers and waits at a position at which transfer between a load port and the overhead travelling vehicle is not prevented.
3) The slidable buffers 12 may be retracted for the installation of the temporary storage apparatus 2, the maintenance and the transportation of equipment, and so on, and therefore, these works may be done easily.
4) When the slidable buffers 12 are retracted, the overhead travelling vehicle and the local vehicle 10 may transfer a carrier between a load port.
5) The damper 17 makes the slidable buffers 12 easily and manually rotatable.
6) The controller for the overhead travelling vehicle is notified when the slidable buffers 12 are retracted, and therefore, transportation by the overhead travelling vehicle is not disturbed.
7) The temporary storage apparatus 2 is supported by the trestle 24 from the floor, and therefore, the temporary storage apparatus 2 may be installed without working at a high place.
8) The trestle 24 does not protrude over the load ports toward the passage 7, and therefore, the temporary storage apparatus 2 does not make the passage 7 narrower.

9) Since the trestle 24 is divided into the upper part and the lower part, the installation of the temporary storage apparatus 2 becomes easier.

In the embodiment, the guide mechanism 68 and the cell 72 are retracted by the hinge 15 with rotation about the horizontal axis, however, the retraction mechanism is arbitrary. Also, the temporary storage apparatus 2 may be supported from the ceiling via the travelling rail 4 for the overhead travelling vehicle, or the like, without the trestle 24.

LIST OF REFERENCE NUMERALS 2, 40, 60: temporary storage apparatus for storing carriers (temporary storage apparatus)
4: travelling rail for overhead travelling vehicles 6: equipment 7: passage
8: travelling rail for local vehicles 10: local vehicle
12: slidable buffer 11, 13: frame
14: fixed buffer 15: hinge 16: load port
17: damper 18: carrier 20: optical sensor
21: reflection plate 22: buffer controller (controller)
24: trestle 25, 26: front face 27: upper part 28: lower part
29: connecting portion 30: overhead travelling vehicle (OHT) 32: travelling section
33: lateral transfer mechanism 34: raising and lowering drive 35: elevation platform
36: belt 38: anti-fall hood 62: wheel
63: raising and lowering drive 64: elevation platform 68: guide mechanism
70: base 71: rail 72: cell 73: wheel
74: positioning pin 75: carrier sensor 76: seating sensor
77: ID reader 78: cylinder 79: piston
80: linear guide 81: rail 82: toothed belt
83, 84: sensor 85: cable guide
86, 88: bracket 87: pin hole 89: pin
100: overhead travelling vehicle controller 102: map

What is claimed is:

1. A temporary storage apparatus temporarily storing carriers between overhead travelling vehicles and a load port located in front of equipment, comprising:
   a local vehicle provided with a hoist for raising and lowering a carrier;
   a travelling rail for the local vehicle passing over the load port and provided below a travelling path of the overhead travelling vehicles;
   a slidable buffer comprising: a cell configured to support a carrier thereon; and a guide mechanism configured to support and slide the cell between an advanced position under the travelling rail and a backwards position laterally separated from the travelling rail; and
   a controller that controls the slidable buffer and the local vehicle;
   wherein the guide mechanism is configured to move between an active position laterally protruding from the travelling rail and a retracted position laterally less protruding from the travelling rail by a shorter length than the active position and allowing an overhead travelling vehicle to transfer a carrier between the load port,
   the guide mechanism is attached to a frame of the temporary storage apparatus in a rotatable manner about an axis parallel to the travelling rail together with the cell, and the guide mechanism and the cell are made separated from positions under the travelling rail at the retracted position,
   the travelling rail extends along a front face of the equipment to a waiting position separated from a position over the load port,
   the controller is configured and programmed to notify another controller for the overhead travelling vehicle that the slidable buffer is disabled when the guide mechanism is moved to the retracted position, and
   the local vehicle is configured to wait at the waiting position.

2. The temporary storage apparatus according to claim 1, further comprising a horizontal axis rotatably supporting the guide mechanism so that the guide mechanism extends along a vertical direction at the retracted position.

3. The temporary storage apparatus according to claim 2, further comprising:
   a lower trestle part configured to be fixed on a floor surface, and
   an upper trestle part detachable from the lower trestle part and fixed with a frame of the temporary storage apparatus,
   wherein the travelling rail and the guide mechanism are attached to the frame.

4. A temporary storage method for temporarily storing carriers between overhead travelling vehicles and a load port located in front of equipment, with usage of a temporary storage apparatus comprising:
   a local vehicle provided with a hoist for raising and lowering a carrier;
   a travelling rail for the local vehicle passing over the load port and provided below a travelling path of the overhead travelling vehicles;
   a slidable buffer comprising: a cell configured to support a carrier thereon;
   a guide mechanism configured to support and slide the cell between an advanced position under the travelling rail and a backwards position laterally separated from the travelling rail;
   a horizontal axis configured to rotate the guide mechanisms; and
   a controller is configured and programmed to notify another controller for the overhead travelling vehicle that the slidable buffer is disabled when the guide mechanism is moved to the retracted position, and
   wherein the temporary storage method comprising the steps of:
   under control of the controller, moving the local vehicle to a waiting position to wait, when no work is allocated to the local vehicle; and
   changing an attitude of the slidable buffer between an active position at which the guide mechanism laterally protrudes from the travelling rail and a retracted position at which the guide mechanism extends in a height direction, by rotating the slidable buffer about the horizontal axis.

* * * * *